(12) United States Patent
Nishita et al.

(10) Patent No.: US 11,393,896 B2
(45) Date of Patent: Jul. 19, 2022

(54) SEMICONDUCTOR DEVICE AND MODULE

(71) Applicant: Murata Manufacturing Co., Ltd., Nagaokakyo (JP)

(72) Inventors: Koichi Nishita, Nagaokakyo (JP);
Masaki Takeuchi, Nagaokakyo (JP);
Yutaka Takeshima, Nagaokakyo (JP);
Kazuhiro Inoue, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/090,024

(22) Filed: Nov. 5, 2020

(65) Prior Publication Data
US 2021/0226001 A1 Jul. 22, 2021

(30) Foreign Application Priority Data

Jan. 17, 2020 (JP) ............................. JP2020-006118
Aug. 26, 2020 (JP) ............................. JP2020-142899

(51) Int. Cl.
| H01L 27/108 | (2006.01) |
| H01L 21/10 | (2006.01) |
| H01L 49/02 | (2006.01) |
| H01G 4/38 | (2006.01) |
| H01L 27/08 | (2006.01) |
| H01L 27/22 | (2006.01) |
| H01L 29/66 | (2006.01) |
| H01L 29/94 | (2006.01) |

(52) U.S. Cl.
CPC ............. *H01L 28/75* (2013.01); *H01G 4/38* (2013.01); *H01L 27/0805* (2013.01); *H01L 27/224* (2013.01); *H01L 28/91* (2013.01); *H01L 29/66181* (2013.01); *H01L 29/945* (2013.01)

(58) Field of Classification Search
CPC ... H01L 27/224; H01L 29/66181; H01L 29/945
USPC .................. 438/244, 386, 387; 257/298–301
See application file for complete search history.

(56) References Cited

U.S. PATENT DOCUMENTS

| 9,431,476 B2* | 8/2016 | Cho .................... H01L 21/764 |
| 10,297,658 B2* | 5/2019 | Zelner .................. H01G 4/1227 |
| 10,418,182 B2* | 9/2019 | Fishburn ................ H01L 28/00 |
| 10,636,795 B2* | 4/2020 | Ahn .................. H01L 27/10855 |
| 2011/0095396 A1* | 4/2011 | Fumitake .......... H01L 27/10852 257/532 |
| 2018/0315550 A1 | 11/2018 | Ryou et al. |

FOREIGN PATENT DOCUMENTS

| CN | 111162096 | * | 1/2020 | ............ H01L 27/12 |
| JP | H0888321 A | | 4/1996 | |
| JP | 5967153 B2 | | 8/2016 | |

\* cited by examiner

*Primary Examiner* — Calvin Lee
(74) *Attorney, Agent, or Firm* — ArentFox Schiff LLP (57) ABSTRACT

A semiconductor device that includes a semiconductor substrate having a first main surface and a second main surface that face each other in a thickness direction, the first main surface containing a trench; an insulation layer on a surface of the trench; a first electrode layer on the insulation layer; a first dielectric layer on the first electrode layer; and a second electrode layer on the first dielectric layer, in which a thickness ($L_1$) of the insulation layer, a thickness ($L_2$) of the first electrode layer, and a thickness ($L_4$) of the second electrode layer satisfy $L_1 > L_2 > L_4$.

19 Claims, 10 Drawing Sheets

SEMICONDUCTOR DEVICE AND MODULE

CROSS REFERENCE TO RELATED APPLICATIONS

The present application claims priority to Japanese Patent Application No. 2020-006118, filed Jan. 17, 2020, and Japanese Patent Application No. 2020-142899, filed Aug. 26, 2020, the entire contents of each of which are incorporated herein by reference.

BACKGROUND OF THE INVENTION

Field of the Invention

The present invention relates to a semiconductor device and a module.

Description of the Related Art

A capacitor has been known which has an electrostatic capacitance increased by forming fine grooves (also called trenches) on a surface of a semiconductor substrate to improve a surface area and forming metal insulator metal (MIM) as a capacitor on the surface.

US Patent Application Publication No. 2018/0315550 discloses a capacitor in which a V-shaped trench is formed in a substrate and MIM is formed on the surface of the trench with an insulation layer interposed therebetween.

Japanese Patent No. 5967153 discloses that, in forming the MIM on an uneven surface generated by the groove formed on a surface of a substrate material, a chip size for obtaining the same capacitance can be reduced to about ⅓ by providing stripe-shaped grooves having a depth of 5 μm, a width of 3 μm, and an interval of 2 μm.

Japanese Patent Application Laid-Open No. 08-88321 discloses a method of forming a trench by etching the surface of a semiconductor substrate and forming a silicon oxide film on the surface of the trench by thermal oxidation or a CVD method.

SUMMARY OF THE INVENTION

However, in the process of manufacturing the capacitor disclosed in US Patent Application Publication No. 2018/0315550, cracks may be generated in the substrate in some cases.

When the inventors diligently studied this problem, it was assumed that the problem was caused by the strain generated when the film was formed on the surface of the trench. In a case where an insulation layer is provided on an inner surface of the trench, the insulation layer is formed by the thermal oxidation method or the CVD method as disclosed in Japanese Patent Application Laid-Open No. 08-88321. In the case of the thermal oxidation method, since a thermal oxide film grows so as to expand from the surface of the groove, it is considered that, in a case where a trench having a tapered tip end is formed as in US Patent Application Publication No. 2018/0315550, the grown thermal oxide films are in contact with each other at the tip end portion of the trench, and an outward stress is generated at the contact point.

It is considered that even if the insulation layers are in contact with each other at the tip end portion of the trench, the insulation layer alone does not lead to a stress that causes a crack in the substrate. However, when a lower electrode and an upper electrode are further formed on the surface of the insulation layer, the insulation layer is also heated depending on the conditions for forming the lower electrode and the upper electrode. Therefore, it is considered that when the lower electrode and the upper electrode are formed, a stress is further applied to the insulation layer and the stress is accumulated. It is considered that a stress such as voltage application or temperature rise is applied to the insulation layer in which the stress has already been accumulated, to exceed an allowable amount of stress accumulated in the insulation layer, and thus cracks are generated in the semiconductor substrate.

The invention has been made to solve the above problems, and an object of the invention is to provide a semiconductor device and a module in which cracks are less likely to be generated in a manufacturing process.

A semiconductor device of the invention includes a semiconductor substrate having a first main surface and a second main surface that face each other in a thickness direction, the first main surface containing a trench; an insulation layer on a surface of the trench; a first electrode layer on the insulation layer; a first dielectric layer on the first electrode layer; and a second electrode layer on the first dielectric layer, in which a thickness ($L_1$) of the insulation layer, a thickness ($L_2$) of the first electrode layer, and a thickness ($L_4$) of the second electrode layer satisfy $L_1>L_2>L_4$.

Further, a module of the invention is a module including the semiconductor device of the invention, in which a voltage of 600 V or more is applied to the semiconductor device.

According to the invention, it is possible to provide a semiconductor device and a module in which cracks are less likely to be generated in a manufacturing process.

DETAILED DESCRIPTION OF PREFERRED EMBODIMENTS OF THE INVENTION

Hereinafter, a semiconductor device and a module of the invention will be described.

However, the invention is not limited to the following configurations, and can be applied by being appropriately modified without departing from the scope of the invention. It should be noted that a combination of two or more preferable configurations of the respective embodiments of the invention described below is also included in the invention.

Semiconductor Device

A semiconductor device of the invention includes a semiconductor substrate which has a first main surface and a second main surface that face each other in a thickness direction, and the first main surface contains a trench; an insulation layer on a surface of the trench; a first electrode layer on the insulation layer; a first dielectric layer on the first electrode layer; and a second electrode layer on the first dielectric layer, in which a thickness ($L_1$) of the insulation layer, a thickness ($L_2$) of the first electrode layer, and a thickness ($L_4$) of the second electrode layer satisfy relational expression (1).

$$L_1 > L_2 > L_4 \qquad (1)$$

Figure 1:
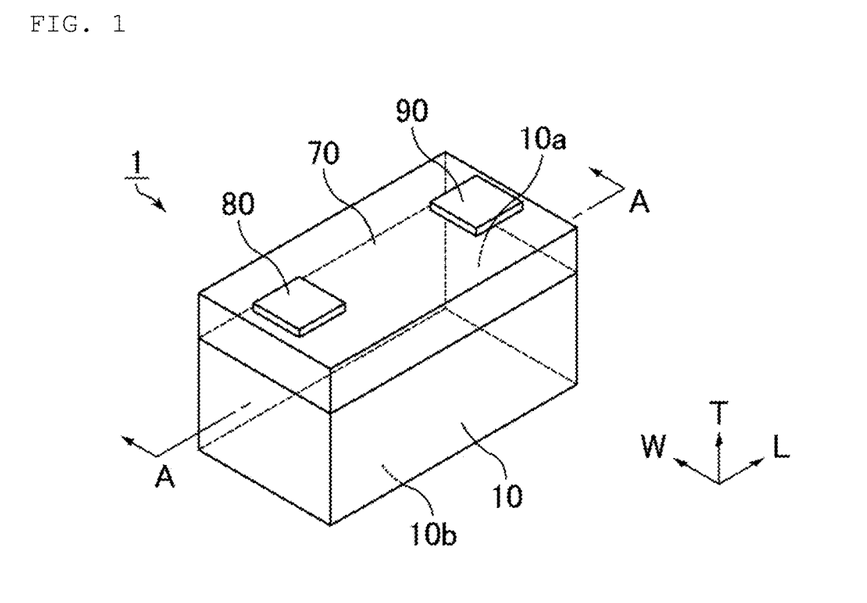
FIG. 1 is a perspective view schematically illustrating an example of a semiconductor device of the invention.
Figure 2:
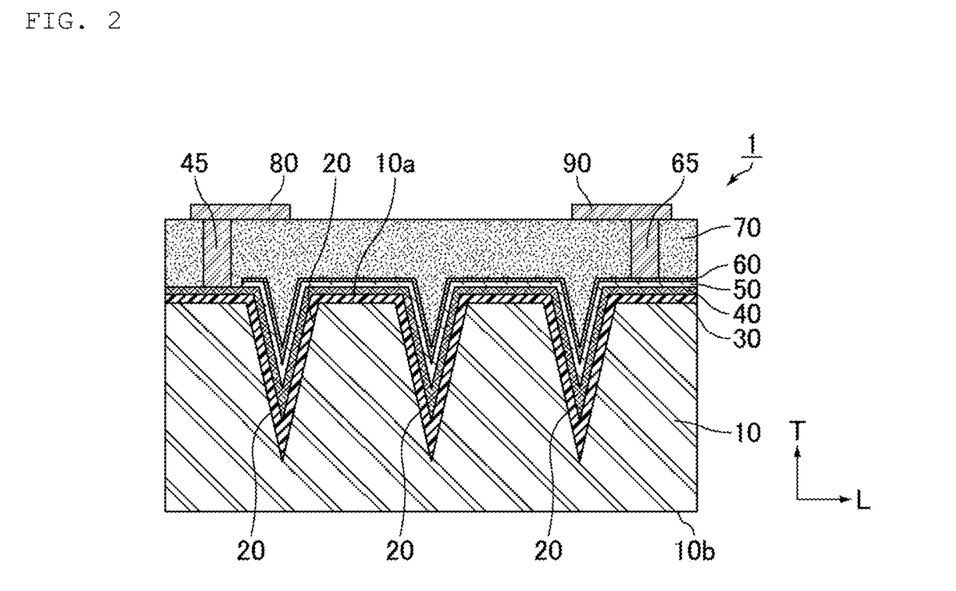
FIG. 2 is a sectional view taken along line A-A in FIG. 1.

FIG. 1 is a perspective view schematically illustrating an example of the semiconductor device of the invention. FIG. 2 is a sectional view taken along line A-A in FIG. 1.

As illustrated in FIGS. 1 and 2, a semiconductor device 1 includes a semiconductor substrate 10 which has a first main surface 10a and a second main surface 10b facing each other in a thickness direction and in which trenches 20 are formed in the first main surface 10a, an insulation layer 30 on the surfaces of the trenches 20, a first electrode layer 40 on the insulation layer 30, a first dielectric layer 50 on the first electrode layer 40, and a second electrode layer 60 on the first dielectric layer 50. Further, a protective layer 70 for protecting the first dielectric layer 50 and the second electrode layer 60 from moisture is on a part of the first dielectric layer 50 and a part of the second electrode layer 60.

The first electrode layer 40, the first dielectric layer 50, and the second electrode layer 60 are collectively referred to as MIM.

The protective layer 70 is provided with a first extended portion 45 and a second extended portion 65 extending in the thickness direction.

The first electrode layer 40 is electrically connected to a first external electrode 80 via the first extended portion 45. The second electrode layer 60 is electrically connected to a second external electrode 90 via the second extended portion 65.

In the semiconductor device of the invention, a plurality of first external electrodes and second external electrodes may be provided.

It is preferable that a first electric resistance value [Ω] of the first extended portion 45 is approximately the same as a second electric resistance value [Ω] of the second extended portion 65. The expression that the first electric resistance value [Ω] of the first extended portion is approximately the same as the second electric resistance value [Ω] of the second extended portion means that a ratio of the first electric resistance value [Ω] of the first extended portion and the second electric resistance value [Ω] of the second extended portion (the first electric resistance value [Ω] of the first extended portion/the second electric resistance value [Ω] of the second extended portion) is 0.9 to 1.1.

It is preferable that the volume of the first extended portion 45 be larger than the volume of the second extended portion 65.

When the volume of the first extended portion 45 is larger than the volume of the second extended portion 65, the sectional area of the first extended portion 45 in a connection path from the first electrode layer 40 to the first external electrode 80 is increased, and thus the first electric resistance value [Ω] of the first extended portion 45 can be reduced.

The volume of the first extended portion and the volume of the second extended portion in the present specification mean the volume of a portion corresponding to the path through which the current flows from the MIM to the external electrode through the first extended portion or the second extended portion. Therefore, the volume of a portion that is clearly unrelated to the path through which the current flows from the MIM to the external electrode is excluded.

The volumes of the first extended portion and the second extended portion can be confirmed by measuring the sectional area and length of the first extended portion and the second extended portion by observing the section of the semiconductor substrate using a scanning electron microscope (SEM).

Figure 3:
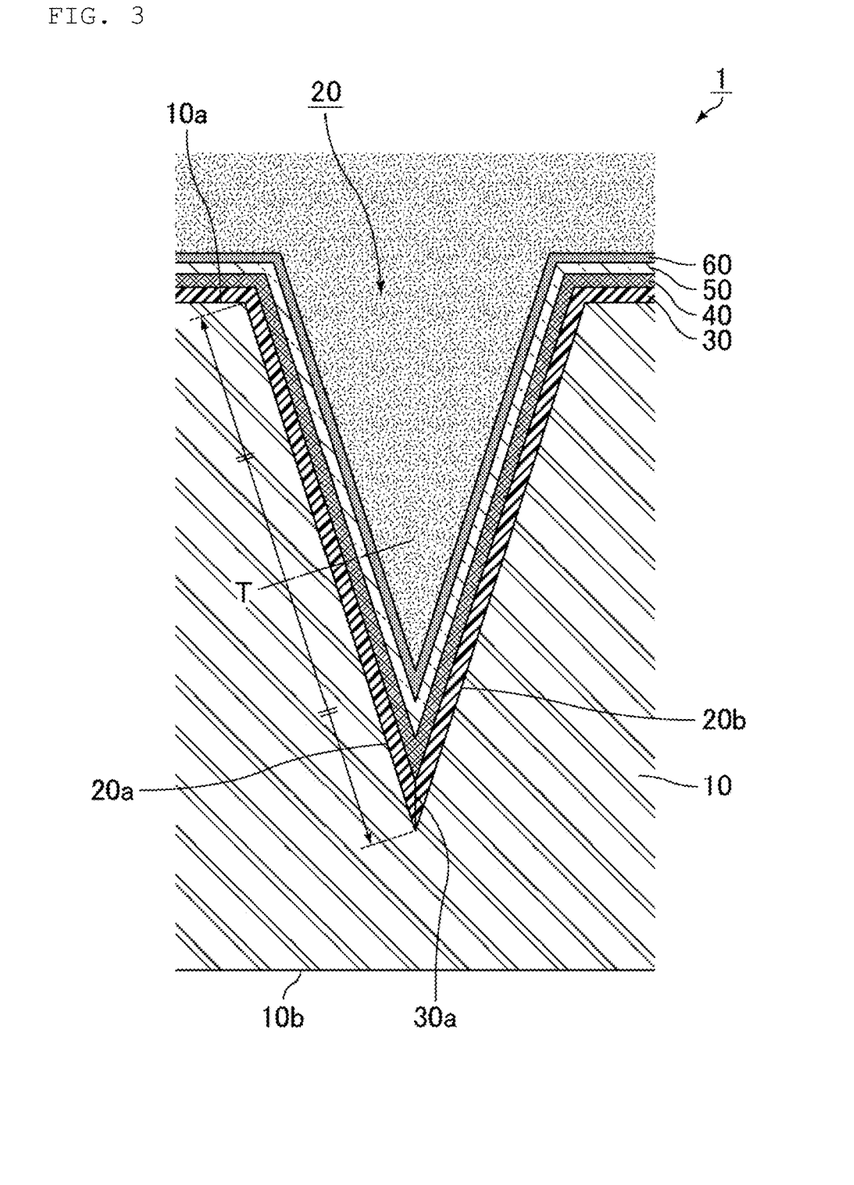
FIG. 3 is an enlarged view of a trench in FIG. 2.
Figure 4:
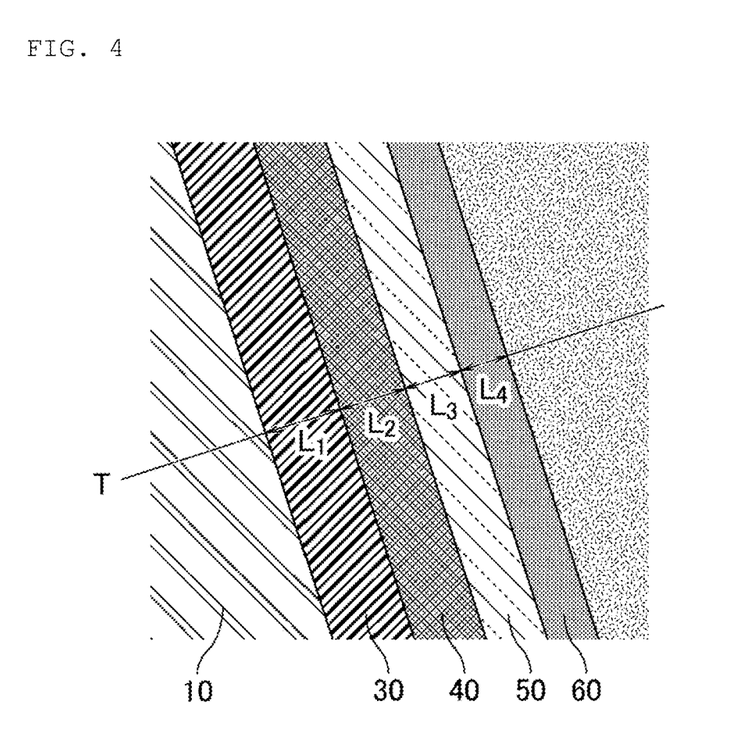
FIG. 4 is an enlarged view of a part of FIG. 3.

FIG. 3 is an enlarged view of the trench in FIG. 2, and FIG. 4 is an enlarged view of a part of FIG. 3.

As illustrated in FIG. 3, the trench 20 has a shape having a predetermined depth in the thickness direction of the semiconductor substrate 10, and has a first side surface 20a and a second side surface 20b which are inclined by a predetermined angle with respect to the thickness direction of the semiconductor substrate 10. The insulation layer 30, the first electrode layer 40, the first dielectric layer 50, and the second electrode layer 60 are provided in this order on the surface of the trench 20, and the thickness ($L_1$) of the insulation layer 30, the thickness ($L_2$) of the first electrode layer 40, and the thickness ($L_4$) of the second electrode layer 60 satisfy the relational expression (1).

$$L_1 > L_2 > L_4 \qquad (1)$$

In FIG. 4, the thickness ($L_1$) of the insulation layer 30, the thickness ($L_2$) of the first electrode layer 40, the thickness ($L_3$) of the first dielectric layer 50, and the thickness ($L_4$) of the second electrode layer 60 are indicated by double-headed arrows.

The thicker the layer formed on the trench, the larger the stress that can be accumulated.

Therefore, on the manufacturing process, by making the thickness ($L_1$) of the insulation layer where the stress is generated frequently larger than the thickness ($L_2$) of the first electrode layer and the thickness ($L_4$) of the second electrode layer, the mechanical strength of the insulation layer can be improved, and the generation of cracks due to the accumulation of stress can be suppressed.

In addition, a stress is generated in the layer provided on the upper side in a direction to push the layer provided on the lower side outward. Therefore, when the thickness ($L_2$) of the first electrode layer is thicker than the thickness ($L_4$) of the second electrode layer, the mechanical strength of the first electrode layer is increased, the stress applied from the second electrode layer to the first electrode layer can be reduced, and the generation of cracks can be suppressed. Since the first electrode layer is arranged to be closer to the inner side of the trench than the second electrode layer, when an extension path from the first electrode layer to the first external electrode is compared with an extension path from the second electrode layer to the second external electrode, the extension path from the first electrode layer to the first external electrode is likely to be longer than the extension path from the second electrode layer to the second external electrode. That is, in a case where the material, the wiring width, and the like of the extension paths are the same, the electric resistance value [Ω] of the extension path from the first electrode layer to the first external electrode becomes larger than the electric resistance value [Ω] of the extension path from the second electrode layer to the second external electrode. However, when the thickness ($L_2$) of the first electrode layer is larger than the thickness ($L_4$) of the second electrode layer, the electric resistance value [Ω] of the first electrode layer is smaller than the electric resistance value [Ω] of the second electrode layer, and therefore, the deviation of the electric resistance value due to the difference in length of the extension path can be alleviated.

The thickness ($L_3$) of the first dielectric layer 50 may be adjusted according to a desired electrostatic capacitance, but is preferably a thickness satisfying the following relational expression (2).

$$L_2 > L_3 > L_4 \quad (2)$$

When the thickness ($L_2$) of the first electrode layer 40, the thickness ($L_3$) of the first dielectric layer 50, and the thickness ($L_4$) of the second electrode layer 60 satisfy the above relational expression (2), since the stress applied from the first dielectric layer 50 to the first electrode layer 40 is reduced and the first dielectric layer 50 has a mechanical strength sufficient to withstand the stress applied from the second electrode layer 60, the generation of cracks due to the accumulation of stress can be further suppressed.

Note that $L_1$, $L_2$, $L_3$, and $L_4$ are the thicknesses of the insulation layer 30, the first electrode layer 40, the first dielectric layer 50, and the second electrode layer 60 on a perpendicular line T drawn toward the insulation layer 30 from a position where the side surface connecting from the surface of the trench 20 exposed to the first main surface 10a to the deepest portion of the trench 20 is divided into two equal parts by observing a cut section obtained by cutting the semiconductor substrate 10 in the thickness direction, using the SEM.

The thickness ($L_1$) of the insulation layer 30 can be appropriately set according to the withstand voltage required for the semiconductor device, and is preferably 1 μm to less than 3 μm, for example.

The thickness ($L_2$) of the first electrode layer 40 is preferably 70% to 90% of the thickness ($L_1$) of the insulation layer 30.

The thickness ($L_2$) of the first electrode layer 40 is preferably, for example, 0.7 μm to 2.7 μm.

The thickness ($L_3$) of the first dielectric layer 50 is preferably 70% to 90% of the thickness ($L_2$) of the first electrode layer 40.

The thickness ($L_3$) of the first dielectric layer 50 is preferably 0.5 μm to 2.4 μm, for example.

The thickness ($L_4$) of the second electrode layer 60 is preferably 70% to 90% of the thickness ($L_3$) of the first dielectric layer 50.

The thickness ($L_4$) of the second electrode layer 60 is preferably 0.3 μm to 2.2 μm, for example.

As illustrated in FIG. 3, a boundary surface 30a where the insulation layer 30 provided on the surface of the first side surface 20a and the insulation layer 30 provided on the surface of the second side surface 20b are in contact with each other is present in the trench 20.

The first side surface 20a and the second side surface 20b are surfaces of the trench which face each other but are not parallel.

In a case where the boundary surface 30a where the insulation layer 30 provided on the surface of the first side surface 20a and the insulation layer 30 provided on the surface of the second side surface 20b are in contact with each other is present in the trench, the stress is likely to be generated in the trench.

On the other hand, in the semiconductor device of the invention, since the stress that the insulation layer 30 can accumulate is large, the generation of cracks in the semiconductor substrate can be suppressed.

In the semiconductor device of the invention, a second dielectric layer may be provided on the second electrode layer, and a third electrode layer may be provided on the second dielectric layer.

By providing the second dielectric layer on the second electrode layer and providing the third electrode layer on the second dielectric layer, the electrostatic capacitance per unit area can be improved. This will be described with reference to FIGS. 5 and 6.

Figure 5:
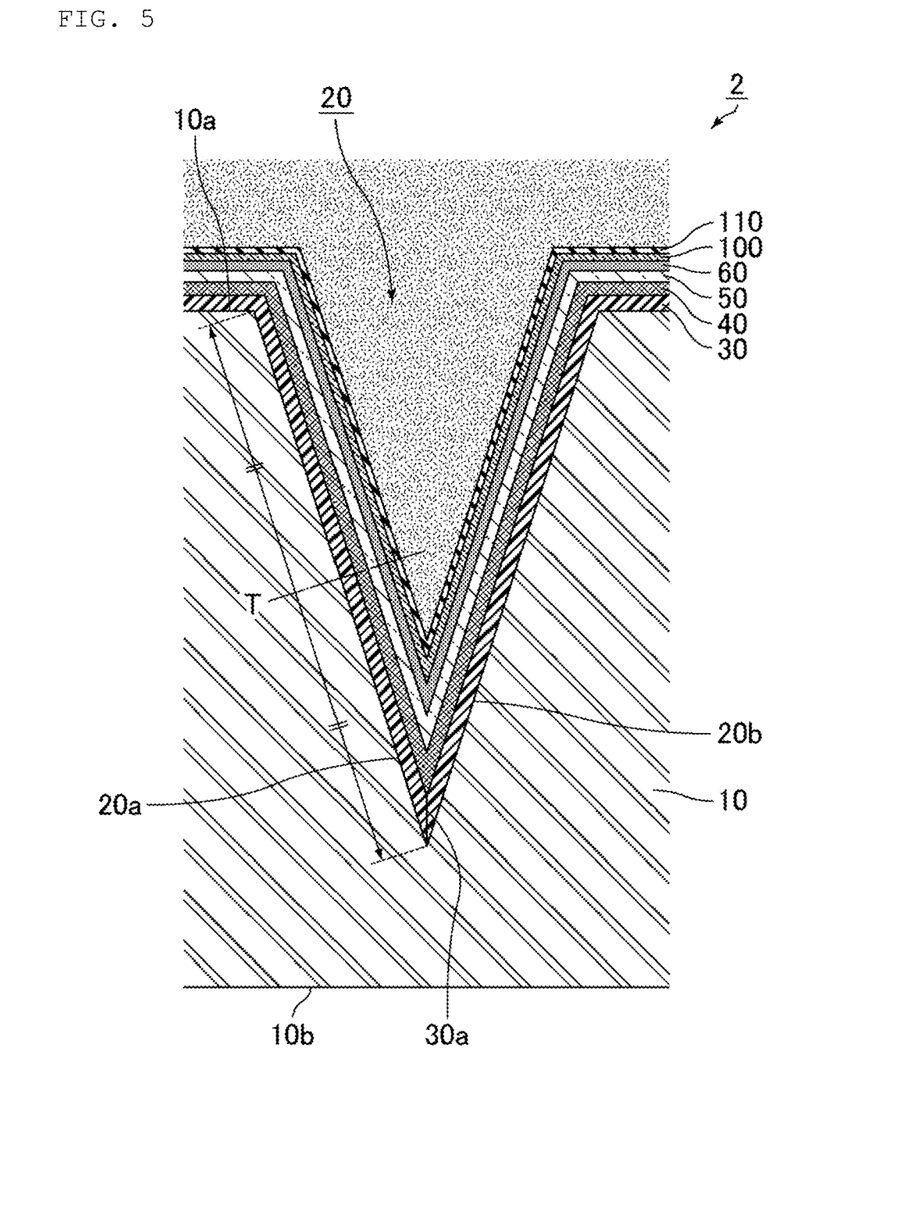
FIG. 5 is an enlarged view of a trench that constitutes another example of the semiconductor device of the invention.
Figure 6:
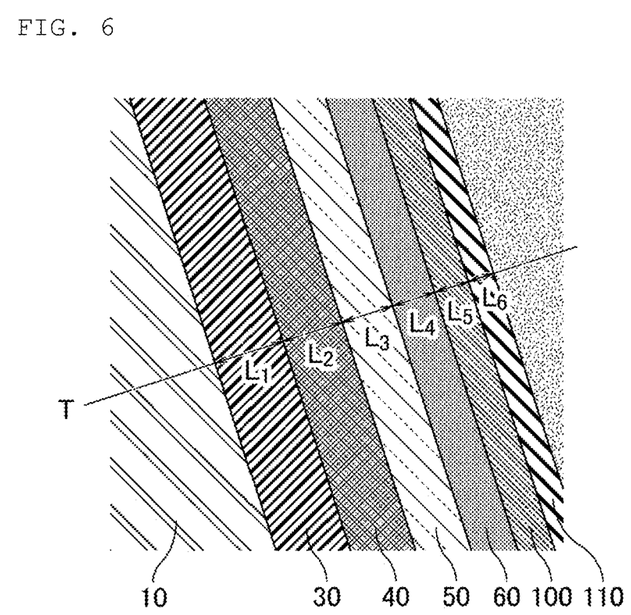
FIG. 6 is an enlarged view of a part of FIG. 5.

FIG. 5 is an enlarged view of a trench that constitutes another example of the semiconductor device of the invention, and FIG. 6 is an enlarged view of a part of FIG. 5.

In a semiconductor device 2 illustrated in FIG. 5, the insulation layer 30 is provided on the surface of the trench 20 provided on the first main surface 10a of the semiconductor substrate 10, the first electrode layer 40 is provided on the insulation layer 30, the first dielectric layer 50 is provided on the first electrode layer 40, the second electrode layer 60 is provided on the first dielectric layer 50, a second dielectric layer 100 is provided on the second electrode layer 60, and a third electrode layer 110 is provided on the second dielectric layer 100.

As illustrated in FIG. 6, it is preferable that the thickness ($L_1$) of the insulation layer 30, the thickness ($L_2$) of the first electrode layer 40, the thickness ($L_4$) of the second electrode layer 60, and the thickness ($L_6$) of the third electrode layer 110 satisfy the relational expression (1) and relational expression (3).

$$L_1 > L_2 > L_4 \quad (1)$$

$$L_4 > L_6 \quad (3)$$

In FIG. 6, the thickness ($L_1$) of the insulation layer 30, the thickness ($L_2$) of the first electrode layer 40, the thickness ($L_3$) of the first dielectric layer 50, the thickness ($L_4$) of the second electrode layer 60, the thickness ($L_5$) of the second dielectric layer 100, and the thickness ($L_6$) of the third electrode layer 110 are indicated by double-headed arrows.

When the thickness ($L_1$) of the insulation layer 30, the thickness ($L_2$) of the first electrode layer 40, the thickness ($L_4$) of the second electrode layer 60, and the thickness ($L_6$) of the third electrode layer 110 satisfy the above relational expression (1) and relational expression (3), since the mechanical strength of the layer close to the surface of the trench is relatively improved and the stress applied from the relatively upper layer to the lower layer can be gradually reduced, the generation of cracks can be suppressed.

The thickness ($L_5$) of the second dielectric layer 100 may be adjusted according to a desired electrostatic capacitance, but it is preferable that the thickness ($L_4$) of the second electrode layer 60, the thickness ($L_5$) of the second dielectric layer 100, and the thickness ($L_6$) of the third electrode layer 110 satisfy the following relational expression (4).

$$L_4 > L_5 > L_6 \quad (4)$$

When the thickness ($L_4$) of the second electrode layer 60, the thickness ($L_5$) of the second dielectric layer 100, and the thickness ($L_6$) of the third electrode layer 110 satisfy the above relational expression (4), since the stress applied from the second dielectric layer 100 to the second electrode layer 60 is reduced and the second dielectric layer 100 has a mechanical strength sufficient to withstand the stress applied from the third electrode layer 110, the generation of cracks due to the accumulation of stress can be further suppressed.

Note that $L_5$ and $L_6$ are the thicknesses of the second dielectric layer 100 and the third electrode layer 110 on the perpendicular line T drawn toward the insulation layer 30 from a position where the side surface connecting from the surface of the trench 20 exposed to the first main surface 10a to the deepest portion of the trench 20 is divided into two equal parts by observing a cut section obtained by cutting the semiconductor substrate 10 in the thickness direction, using the SEM.

The thickness ($L_5$) of the second dielectric layer 100 is preferably 70% to 90% of the thickness ($L_4$) of the second electrode layer 60.

The thickness ($L_5$) of the second dielectric layer 100 is preferably 0.2 μm to 2.0 μm, for example.

The thickness ($L_6$) of the third electrode layer 110 is preferably 70% to 90% of the thickness ($L_5$) of the second dielectric layer 100.

The thickness ($L_6$) of the third electrode layer 110 is preferably 0.1 μm to 1.8 μm, for example.

In the semiconductor device of the invention, the shape of the trench is not particularly limited, but a substantially wedge shape, a substantially conical shape such as a conical shape and an elliptical cone shape, and a substantially polygonal pyramid shape such as a substantially triangular pyramid shape and a substantially quadrangular pyramid shape are exemplified.

The substantially wedge shape is a shape having a predetermined depth in the thickness direction of the semiconductor substrate, and having a first side surface and a second side surface which face each other but are not parallel, and a first end surface and a second end surface which face each other and are substantially parallel.

The substantially cone shape is a shape having a predetermined depth in the thickness direction of the semiconductor substrate and having at least a portion where the sectional area in a plane parallel to the first main surface is decreased from the first main surface toward the second main surface.

Further, the shape of the trench may be a shape in which the apex portion of the substantially cone shape is removed. In this case, the trench having the substantially conical shape has a bottom surface at the deepest portion.

The distance between the side surfaces of the trench which face each other at the deepest portion of the trench is preferably 2 μm or less in order to maximize the number of trenches per unit area.

The arrangement pattern for arranging the trenches on the first main surface of the semiconductor substrate is not particularly limited, but in a case where the shape of the cavity of the trench is circular, a hexagonal close-packing arrangement is preferable. Further, in a case where the shape of the cavity of the trench is square, a lattice arrangement is preferable.

Examples of the shape of the trench will be described with reference to FIGS. 7, 8, 9, 10, 11, and 12.

Figure 7:
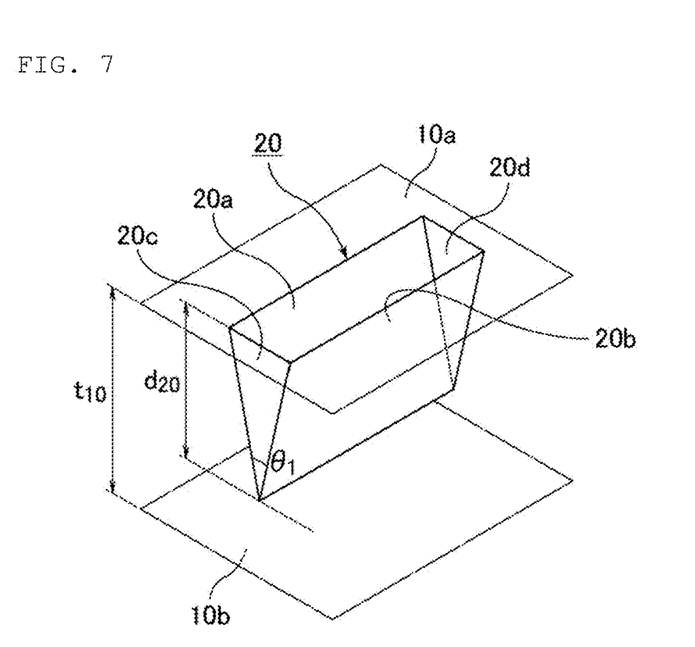
FIG. 7 is a perspective view schematically illustrating an example of the trench illustrated in FIG. 2.

FIG. 7 is a perspective view schematically illustrating an example of the trench illustrated in FIG. 2.

The trench 20 has a substantially wedge shape composed of the first side surface 20a, the second side surface 20b, a first end surface 20c, and a second end surface 20d, and extends from the first main surface 10a toward the second main surface 10b of the semiconductor substrate 10.

The first side surface 20a and the second side surface 20b face each other in a direction orthogonal to the thickness direction, the distance between the first side surface 20a and the second side surface 20b is decreased from the first main surface 10a toward the second main surface 10b, and the first side surface 20a and the second side surface 20b are not parallel. On the other hand, the first end surface 20c and the second end surface 20d are arranged apart from each other so as to face each other in a direction which is orthogonal to the thickness direction and is also orthogonal to a direction in which the first side surface 20a and the second side surface 20b face each other, and the first end surface 20c and the second end surface 20d are substantially parallel. Note that none of the first side surface 20a, the second side surface 20b, the first end surface 20c, and the second end surface 20d is parallel to the first main surface 10a of the semiconductor substrate 10.

The substantially wedge shape is a shape having a first side surface and a second side surface which face each other but are not parallel, and a first end surface and a second end surface which face each other and are substantially parallel. One end portions of the first side surface and the second side surface facing each other are connected by the first end surface, and the other end portions are connected by the second end surface.

The shapes of the first side surface and the second side surface are preferably substantially rectangular shapes, and the shapes of the first end surface and the second end surface are preferably substantially isosceles triangles. In this case, the two long sides forming the substantially isosceles triangle as the first end surface and the second end surface are connected to the substantially rectangular shape as the first side surface and the second side surface, respectively.

Note that the substantially isosceles triangle includes a case where two base angles of the isosceles triangle are not exactly the same and a case where the lengths of two equal sides of the isosceles triangle are not exactly the same. Further, the substantially isosceles triangle includes a trapezoidal shape in which a portion including an apex angle of the isosceles triangle is removed.

The depth $d_{20}$ of the trench 20 is preferably 300 nm to 10000 nm. Further, the depth $d_{20}$ of the trench is preferably 0.1% to 50% of the thickness $t_{10}$ of the semiconductor substrate 10.

Further, as illustrated in FIG. 7, the sectional shape of the trench 20 in a direction parallel to the first end surface 20c and the second end surface 20d is a tapered shape.

As illustrated in FIG. 7, it is preferable that, in the tapered shape, the distance between the first side surface 20a and the second side surface 20b in a direction parallel to the first main surface 10a of the semiconductor substrate 10 is decreased from the first main surface 10a toward the second main surface 10b.

The angle $\theta_1$ formed by the first side surface 20a and the second side surface 20b is not particularly limited, but may be 30° or less.

In a case where $\theta_1$ is 30° or less, a boundary surface where the insulation layer 30 formed on the surface of the first side surface 20a and the insulation layer 30 formed on the surface of the second side surface 20b are in contact with each other is easily generated to increase the possibility of generating cracks by the stress applied to the semiconductor substrate due to the interference between the insulation layers, but even in such a case, the semiconductor device of the invention can suppress the generation of cracks.

The angle $\theta_1$ formed by the first side surface 20a and the second side surface 20b can be confirmed by observing a cut section of the semiconductor substrate 10, which is obtained by cutting the semiconductor substrate in a direction parallel to the first end surface 20c and the second end surface 20d, using the SEM or the like. Further, the angle $\theta_1$ formed by the first side surface 20a and the second side surface 20b matches the angle of the apex angle in a case where the first end surface 20c and the second end surface 20d are regarded as substantially isosceles triangles.

The first side surface 20a and the second side surface 20b may not necessarily be smooth surfaces, and unevenness may be formed on the first side surface 20a and the second side surface 20b.

In a case where unevenness is formed on the first side surface and/or the second side surface, the angle formed by the first side surface and the second side surface can be obtained by the following method.

First, a trench is observed on a cut section obtained by cutting the semiconductor substrate in a direction parallel to the first end surface and the second end surface. Then, on the cut section, each of a line segment that minimizes the sum of squares of the distance displacement from the first side surface and a line segment that minimizes the sum of squares of the distance displacement from the second side surface is obtained.

The angle formed by the two line segments is the angle formed by the first side surface and the second side surface. The above method can be applied even in a case where the trench has a bottom surface.

Each surface forming the trench can be confirmed by, for example, observing a section of the semiconductor substrate using the SEM. Each surface forming the trench can be confirmed by observing the surface of the semiconductor substrate forming the surface of the trench or the boundary surface between the semiconductor substrate and the insulation layer formed on the surface of the trench, using the SEM. In a case where the boundary surface between the semiconductor substrate and the insulation layer cannot be confirmed, each surface forming the trench may be recognized by ignoring the thickness of the insulation layer. On the other hand, in a case where the boundary surface between the semiconductor substrate and the insulation layer can be confirmed, the boundary surface between the semiconductor substrate and the insulation layer may be recognized as each surface forming the trench.

Figure 8:
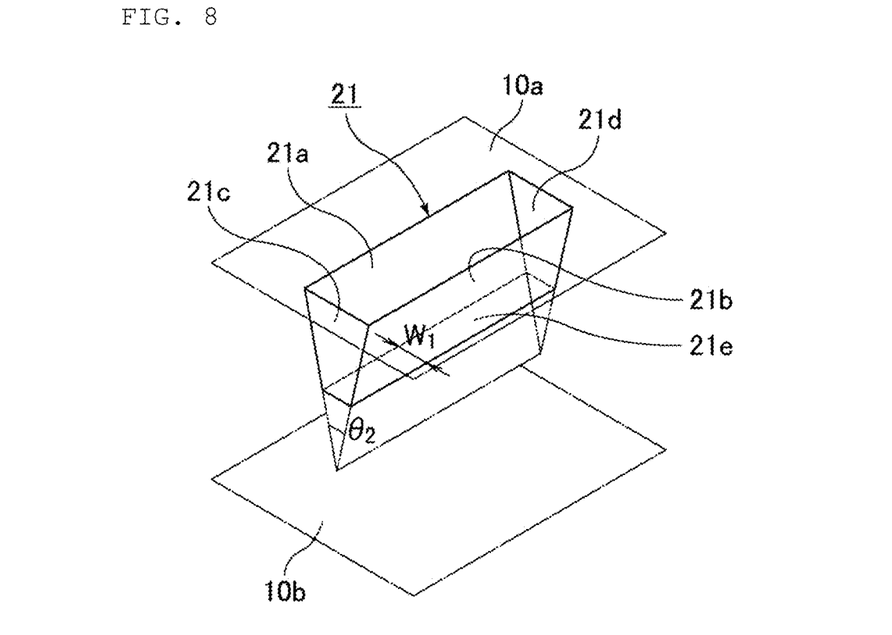
FIG. 8 is a perspective view schematically illustrating another example of the trench.

FIG. 8 is a perspective view schematically illustrating another example of the trench.

A trench 21 has a substantially wedge shape composed of a first side surface 21a, a second side surface 21b, a first end surface 21c, a second end surface 21d, and a first bottom surface 21e. The first bottom surface 21e is provided between the first side surface 21a and the second side surface 21b, and the first side surface 21a and the second side surface 21b are not in direct contact with each other.

The angle $\theta_2$ formed by the first side surface 21a and the second side surface 21b may be 30° or less. As the angle $\theta_2$ formed by the first side surface 21a and the second side surface 21b is smaller, a trench having a higher aspect ratio (larger aspect ratio) can be formed, and the capacitance density of the semiconductor substrate per unit area can be increased.

In order to increase the number of trenches per unit area, the distance $W_1$ between the first side surface 21a and the second side surface 21b at the deepest portion (position where the first bottom surface 21e is provided) of the trench 21 is preferably set to 2 μm or less.

In a case where the distance $W_1$ between the first side surface 21a and the second side surface 21b at the deepest portion of the trench 21 is 2 μm or less, cracks are easily generated on the semiconductor substrate due to the insulation layer formed on the surface of the trench, but the semiconductor device of the invention can suppress the generation of cracks.

Figure 9:
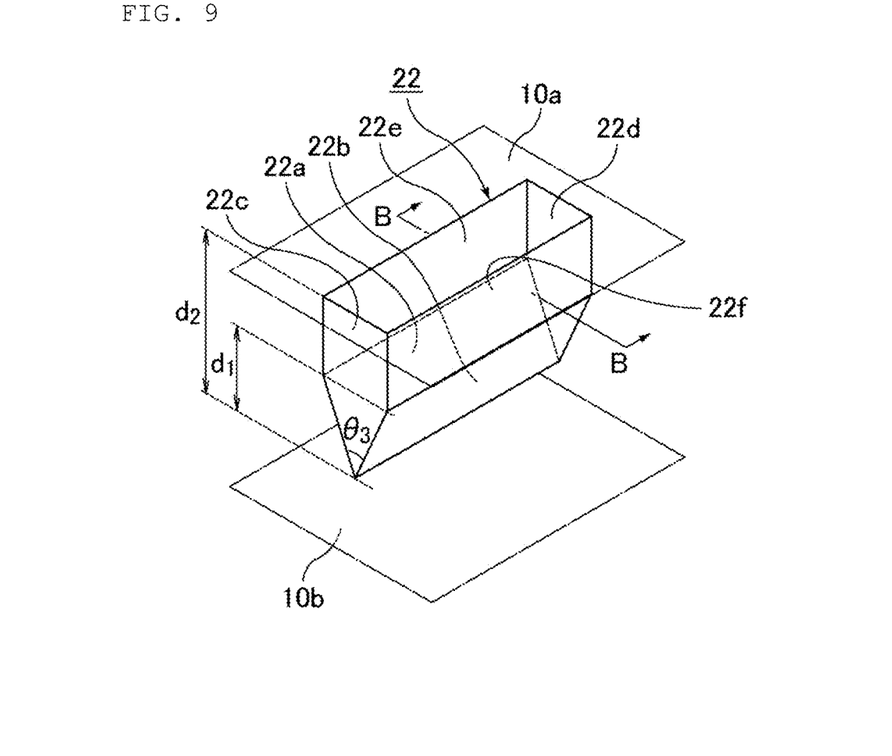
FIG. 9 is a perspective view schematically illustrating still another example of the trench.
Figure 10:
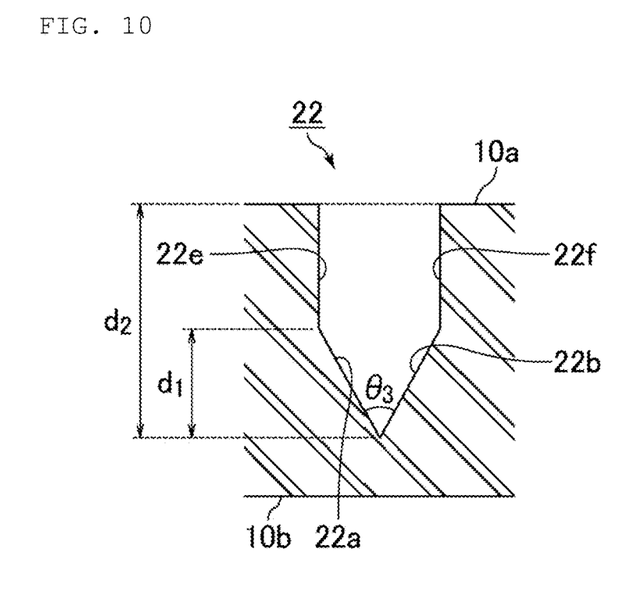
FIG. 10 is a sectional view taken along line B-B in FIG. 9.

FIG. 9 is a perspective view schematically illustrating still another example of the trench, and FIG. 10 is a sectional view taken along line B-B in FIG. 9.

As illustrated in FIG. 9, a trench 22 has a substantially wedge shape composed of a first side surface 22a, a second side surface 22b, a first end surface 22c, a second end surface 22d, a third side surface 22e, and a fourth side surface 22f. As illustrated in FIG. 10, the length of each of the first side surface 22a and the second side surface 22b extending in the thickness direction of the semiconductor substrate 10 is a length indicated by a double-headed arrow $d_1$. On the other hand, the length of each of the first end surface 22c and the second end surface 22d extending in the thickness direction of the semiconductor substrate 10 is a length indicated by a double-headed arrow $d_2$. The length $d_1$ of each of the first side surface 22a and the second side surface 22b extending in the thickness direction of the semiconductor substrate 10 is shorter than the length $d_2$ of the first end surface 22c and the second end surface 22d extending in the thickness direction of the semiconductor substrate 10. The third side surface 22e is provided between the first main surface 10a and the first side surface 22a. Further, the fourth side surface 22f is provided between the first main surface 10a and the second side surface 22b.

The third side surface 22e has a substantially rectangular shape formed by a locus obtained by moving a side of the first side surface 22a on the first main surface 10a side up to the first main surface 10a along the thickness direction of the semiconductor substrate 10. The fourth side surface 22f has a substantially rectangular shape formed by a locus obtained by moving a side of the second side surface 22b on the first main surface 10a side up to the first main surface 10a along the thickness direction of the semiconductor substrate 10.

The angle $\theta_3$ formed by the first side surface 22a and the second side surface 22b is not particularly limited, but may be 30° or less, for example.

The third side surface 22e and the fourth side surface 22f are substantially parallel and face each other, and respectively connect the first main surface 10a to the first side surface 22a, and the first main surface 10a to the second side surface 22b. Therefore, the third side surface 22e is located closer to the first main surface 10a than the first side surface 22a, and the fourth side surface 22f is located closer to the first main surface 10a than the second side surface 22b.

The third side surface 22e and the fourth side surface 22f may be substantially parallel to each other or may not be parallel.

As a case where the third side surface 22e and the fourth side surface 22f are not parallel, for example, a case where the distance between the third side surface 22e and the fourth side surface 22f is decreased from the first main surface 10a toward the second main surface 10b is exemplified.

Figure 11:
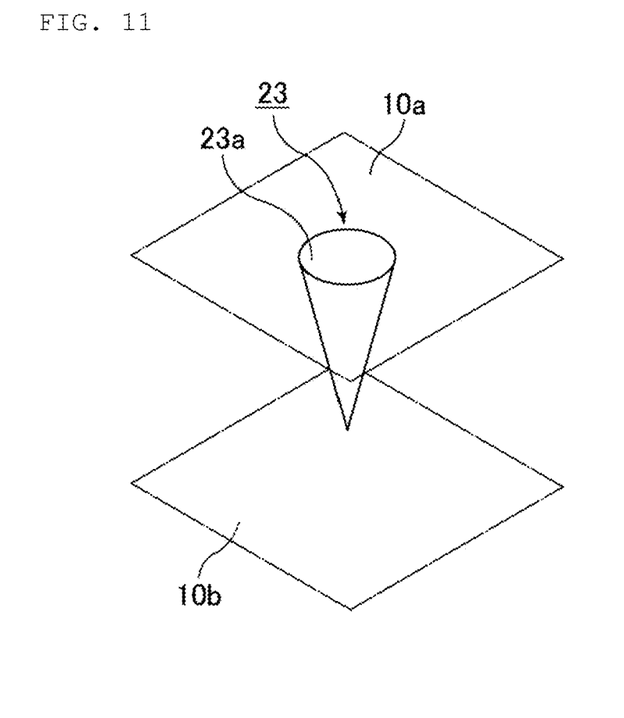
FIG. 11 is a perspective view schematically illustrating still another example of the trench.

FIG. 11 is a perspective view schematically illustrating still another example of the trench.

A trench 23 has a conical shape having a side surface 23a, and the sectional area in a plane parallel to the first main surface 10a of the semiconductor substrate 10 is decreased from the first main surface 10a toward the second main surface 10b.

The trench 23 is composed of the side surface 23a inclined at a predetermined angle with respect to the first main surface 10a. In a section which is parallel to the thickness direction of the semiconductor substrate 10 and passes through the apex of the cone, the minimum value of the angle formed by the side surface 23a forming the trench 23 may be 30° or less.

Figure 12:
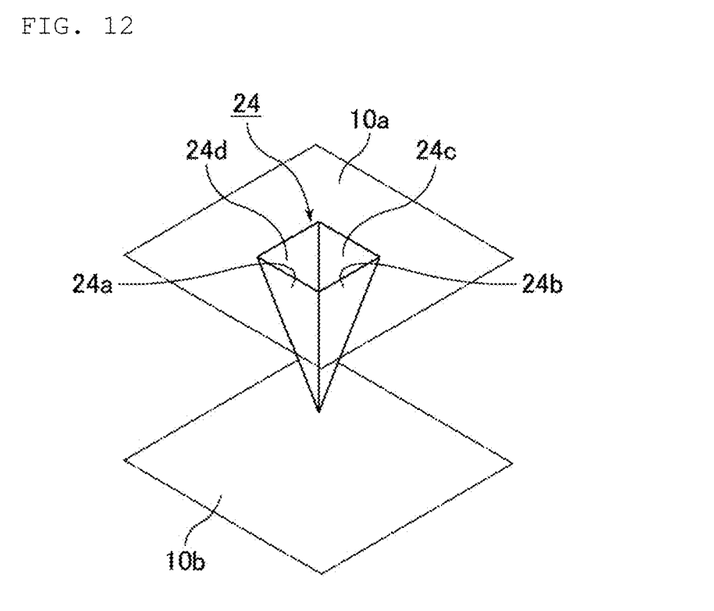
FIG. 12 is a perspective view schematically illustrating still another example of the trench.

FIG. 12 is a perspective view schematically illustrating still another example of the trench.

A trench 24 has a quadrangular pyramid shape having four side surfaces (first side surface 24a, second side surface 24b, third side surface 24c, and fourth side surface 24d), and the sectional area in a plane parallel to the first main surface 10a of the semiconductor substrate 10 is decreased from the first main surface 10a toward the second main surface 10b.

It is preferable that each of the four side surfaces be inclined by 30° or more with respect to the first main surface 10a.

In a case of forming the MIM in the trench having a substantially cone shape as illustrated in FIG. 11 and FIG. 12, it is preferable that a boundary surface where the insulation layers provided on the surfaces of the trench, which face each other but are not parallel, are in contact with each other be present in the trench.

In a case where a boundary surface where the insulation layers provided on the surfaces of the trench, which face each other but are not parallel, are in contact with each other is present in the trench, the stress is likely to be generated in the trench. On the other hand, in the semiconductor device of the invention, since the stress that the insulation layer can accumulate is large, the generation of cracks in the semiconductor substrate can be suppressed.

The semiconductor device of the invention may include two or more independent MIMs.

In this case, the first external electrode and the second external electrode may be connected to each of the independent MIMs.

In a case where a plurality of first external electrodes and second external electrodes are provided, it is preferable that the polarities of adjacent external electrodes be reversed.

Figure 13:
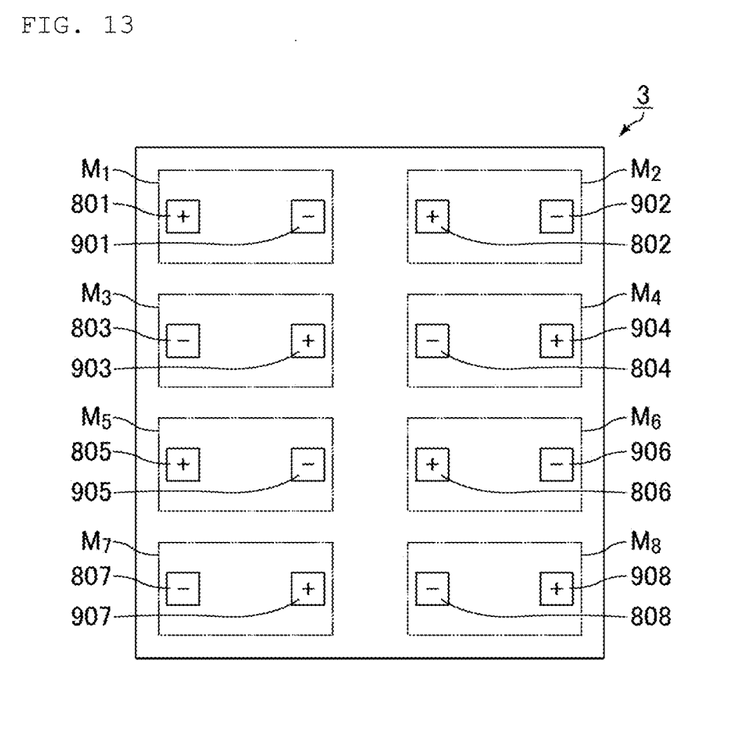
FIG. 13 is a top view schematically illustrating still another example of the semiconductor device of the invention.

FIG. 13 is a top view schematically illustrating still another example of the semiconductor device of the invention.

A semiconductor device 3 includes eight independent MIMs ($M_1$, $M_2$, $M_3$, $M_4$, $M_5$, $M_6$, $M_7$, and $M_8$). Each MIM is composed of a first electrode layer provided on an insulation layer, a first dielectric layer provided on the first electrode layer, and a second electrode layer provided on the first dielectric layer. The semiconductor device 3 further includes first external electrodes (801, 802, 803, 804, 805, 806, 807, and 808) and second external electrodes (901, 902, 903, 904, 905, 906, 907, and 908) which are connected to the respective MIMs.

The MIM ($M_1$) is connected to the first external electrode 801 and the second external electrode 901, and the MIM ($M_3$) adjacent to the MIM ($M_1$) is connected to the first external electrode 803 and the second external electrode 903.

Therefore, the first external electrode 801 and the first external electrode 803 are external electrodes which are connected to different MIMs and are adjacent to each other. Here, in a case where a voltage is applied in a direction so that the polarity of the first external electrode 801 is (+) and the polarity of the first external electrode 803 is (−), in the semiconductor device 3, the polarities of the external electrodes which are connected to the different MIMs and are adjacent to each other are different.

In a case where the polarities of the external electrodes which are connected to the different MIMs and are adjacent to each other are different, the magnetic fields generated around the external electrodes and the extended portion cancel each other out, and the inductances cancel each other out, so that ESL can be reduced.

In a case of distinguishing the external electrode having a polarity of (+) and the external electrode having a polarity of (−) from each other, there is a method of giving a design as a mark to the external electrode having any one of the polarities.

Subsequently, each configuration of the semiconductor device of the invention will be described.

Examples of the material for forming the semiconductor substrate include silicon.

The electrical resistivity of the semiconductor substrate is preferably $10^{-5}$ Ωcm or more and $10^5$ Ωcm or less.

The external dimensions of the semiconductor substrate are not particularly limited, but it is preferable that the length be 1 mm to 3 mm, the thickness be 0.3 mm to 3 mm, and the width be 1 mm to 3 mm.

The insulation layer is preferably formed of an oxide of the material forming the semiconductor substrate.

In a case where the semiconductor substrate is silicon, the insulation layer is preferably a silicon oxide.

The material forming the first electrode layer is preferably a metal or an alloy.

Since the metal or the alloy as the material forming the first electrode layer has a coefficient of thermal expansion larger than that of ceramic or the like, the stress is likely to be accumulated in the trench during the process of manufacturing the semiconductor device.

Even in a case where the first electrode layer is formed of a material such as a metal or an alloy in which the stress is easily accumulated in the trench, the semiconductor device of the invention can suppress the generation of cracks.

Examples of the metal forming the first electrode layer include metals such as Cu, Ag, Au, Al, Ni, Cr, and Ti.

Examples of the alloy forming the first electrode layer include alloys containing the metals mentioned above as the metal forming the first electrode layer.

Examples of the material forming the dielectric layer include materials having dielectric properties or insulating properties such as oxides such as SiO, $Al_2O_3$, $HfO_2$, $Ta_2O_5$ and $ZrO_2$, and nitrides such as $Si_3N_4$.

As the material forming the second electrode layer, the same material as the material forming the first electrode layer can be preferably used.

As the material forming the second dielectric layer, the same material as the material forming the dielectric layer can be preferably used.

As the material forming the third electrode layer, the same material as the material forming the first electrode layer can be preferably used.

Examples of the material forming the first extended portion and the second extended portion include Cu and Al.

The first extended portion and the second extended portion may be formed of the same material, but it is preferable that the electrical resistivity [Ωcm] of the material forming the first extended portion be smaller than the electrical resistivity [Ωcm] of the material forming the second extended portion.

Examples of the material forming the first external electrode and the second external electrode include Cu and Al.

A plating layer may be formed on the outermost surfaces of the first external electrode and the second external electrode. Examples of the plating layer include an Au plating layer and a Sn plating layer.

The material forming the first external electrode and the material forming the second external electrode may be the same as or different from each other.

In the semiconductor device of the invention, a protective layer for protecting the dielectric layer and/or the second electrode layer from moisture may be formed on a part of the dielectric layer and the second electrode layer.

Examples of the material forming the protective layer 70 include polyimide resin, silicon nitride, and silicon oxide.

The thickness of the protective layer 70 is not particularly limited, but is preferably 1 µm to 20 µm.

Module

A module of the invention includes the semiconductor device of the invention.

Since the module of the invention includes the semiconductor device of the invention, cracks are unlikely to be generated due to the stress when a voltage is applied.

In the module of the invention, a voltage of 600 V or higher may be applied to the semiconductor device.

Since the semiconductor device constituting the module of the invention is the semiconductor device of the invention, cracks are unlikely to be generated even in a case where a voltage of 600 V or higher is applied.

In the module of the invention, it is preferable that a switching element be connected to the semiconductor device.

When the switching element is connected to the semiconductor device, it is possible to cope with the application of alternating current.

Figure 14:
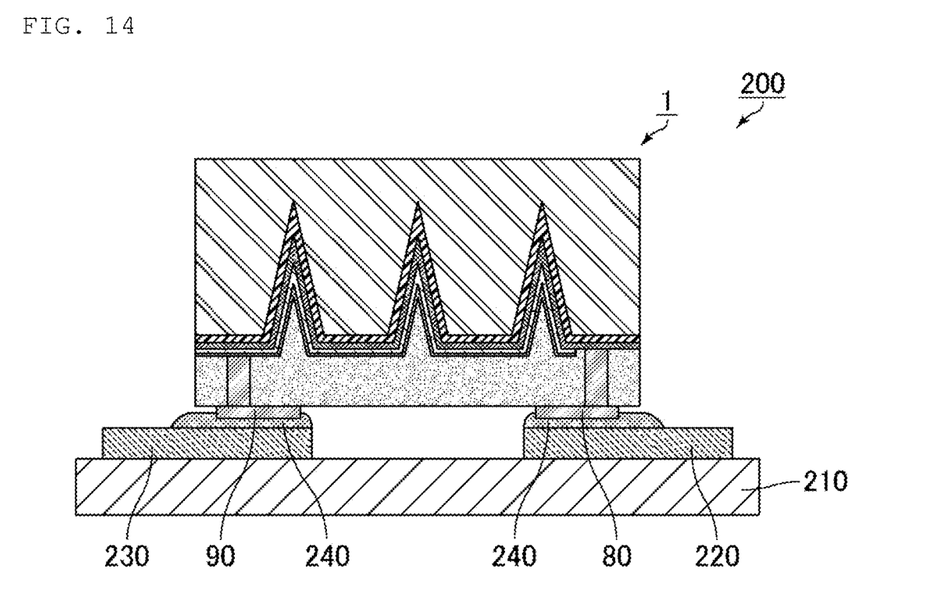
FIG. 14 is a sectional view schematically illustrating an example of a module of the invention.

FIG. 14 is a sectional view schematically illustrating an example of the module of the invention.

As illustrated in FIG. 14, a module 200 includes the semiconductor device 1, a first land 220 electrically connected to the first external electrode 80 of the semiconductor device 1, and a second land 230 electrically connected to the second external electrode 90 of the semiconductor device 1. The first external electrode 80 and the first land 220, and the second external electrode 90 and the second land 230 are connected by solder 240. The first land 220 and the second land 230 are fixed on a mounting substrate 210. Therefore, in the module 200, the semiconductor device 1 is mounted on the mounting substrate 210 with the first land 220 and the second land 230 interposed therebetween.

What is claimed is:

1. A semiconductor device comprising:
   a semiconductor substrate which has a first main surface and a second main surface that face each other in a thickness direction, the first main surface containing a trench therein;
   an insulation layer on a surface of the trench;
   a first electrode layer on the insulation layer;
   a first dielectric layer on the first electrode layer;
   a second electrode layer on the first dielectric layer;
   a second dielectric layer on the second electrode layer; and
   a third electrode layer on the second dielectric layer,
   wherein a thickness ($L_1$) of the insulation layer, a thickness ($L_2$) of the first electrode layer, and a thickness ($L_4$) of the second electrode layer satisfy $L_1>L_2>L_4$, and
   wherein the thickness ($L_4$) of the second electrode layer and a thickness ($L_6$) of the third electrode layer satisfy $L_4>L_6$.

2. The semiconductor device according to claim 1, wherein the thickness ($L_4$) of the second electrode layer, a thickness ($L_5$) of the second dielectric layer, and the thickness ($L_6$) of the third electrode layer satisfy $L_4>L_5>L_6$.

3. The semiconductor device according to claim 1, wherein the thickness ($L_2$) of the first electrode layer, a thickness ($L_3$) of the first dielectric layer, and the thickness ($L_4$) of the second electrode layer satisfy $L_2>L_3>L_4$.

4. The semiconductor device according to claim 1, wherein the semiconductor substrate comprises silicon, and the insulation layer comprises a silicon oxide.

5. A module comprising the semiconductor device according to claim 1.

6. The semiconductor device according to claim 1, wherein a thickness of the insulation layer is 1 µm or more.

7. The semiconductor device according to claim 6, wherein the thickness of the insulation layer is 1 µm to 2 µm.

8. The semiconductor device according to claim 1, wherein the trench has a substantially cone shape having a predetermined depth in the thickness direction of the semiconductor substrate, and has at least a portion in which a sectional area in a plane parallel to the first main surface decreases from the first main surface toward the second main surface.

9. The semiconductor device according to claim 8, Wherein, in a section which is parallel to the thickness direction of the semiconductor substrate and passes through an apex of the substantially cone shape, a minimum value of an angle formed by side surfaces of the trench is 30° or less.

10. The semiconductor device according to claim 9, wherein a distance between the side surfaces of the trench which face each other at a deepest portion of the trench is 2 µm or less.

11. The semiconductor device according to claim 1, further comprising:
    a first external electrode electrically connected to the first electrode layer via a first extended portion;
    a second external electrode electrically connected to the second electrode layer via a second extended portion, wherein
    a ratio of a first electric resistance value [Ω] of the first extended portion and a second electric resistance value [Ω] of the second extended portion is 0.9 to 1.1.

12. The semiconductor device according to claim 11, wherein a plurality of MIMs each of which is composed of the first electrode layer, the first dielectric layer, and the second electrode layer are independently provided on the semiconductor substrate,
    the plurality of MIMs are connected to different first external electrodes and second external electrodes, and
    polarities of the external electrodes connected to the different MIMs and are adjacent to each other are different.

13. The semiconductor device according to claim 11, wherein an electrical resistivity [Ωm] of a material of the first extended portion is smaller than an electrical resistivity [Ωm] of a material of the second extended portion.

14. The semiconductor device according to claim 11, wherein a volume of the first extended portion is larger than a volume of the second extended portion.

15. The semiconductor device according to claim 1, wherein the trench has a substantially wedge shape with a predetermined depth in the thickness direction of the semiconductor substrate, and has a first side surface and a second side surface that face each other but are not parallel to each other, and a first end surface and a second end surface that face each other and are substantially parallel to each other.

16. The semiconductor device according to claim 15, wherein a boundary surface where the insulation layers on the first side surface and the second side surface of the trench are in contact with each other is present in the trench.

17. The semiconductor device according to claim 15, wherein a distance between the first side surface and the second side surface at a deepest portion of the trench is 2 μm or less.

18. The semiconductor device according to claim 15, wherein a sectional shape of the trench in a direction parallel to the first end surface and the second end surface is a tapered shape.

19. The semiconductor device according to claim 18, Wherein, in a cut section of the semiconductor substrate in a direction parallel to the first end surface and the second end surface, an angle formed by the first side surface and the second side surface is 30° or less.

* * * * *